United States Patent [19]
Yamashita et al.

[11] Patent Number: 5,918,362
[45] Date of Patent: Jul. 6, 1999

[54] JIG FOR DUAL-SIDE MOUNTING PC BOARDS

[75] Inventors: Hiroaki Yamashita; Yasuhiro Murasawa, both of Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 08/883,900

[22] Filed: Jun. 27, 1997

[30] Foreign Application Priority Data

Feb. 4, 1997 [JP] Japan ................................. 9-021697

[51] Int. Cl.⁶ ..................................................... H05K 3/30
[52] U.S. Cl. ........................ 29/743; 29/740; 29/DIG. 44; 269/21
[58] Field of Search ............................. 29/740, 743, 832, 29/DIG. 44, 739, 760, 840; 269/21

[56] References Cited

U.S. PATENT DOCUMENTS

| | | | |
|---|---|---|---|
| 4,538,878 | 9/1985 | Dambach et al. | 29/739 X |
| 4,914,809 | 4/1990 | Fukai et al. | 29/740 |
| 4,916,807 | 4/1990 | Wiese | 29/840 |
| 5,034,802 | 7/1991 | Liebes, Jr. et al. | 29/832 |
| 5,218,753 | 6/1993 | Suzuki et al. | 29/740 |
| 5,249,343 | 10/1993 | Grosso et al. | 29/743 |
| 5,346,193 | 9/1994 | Kitagawa | 269/21 |
| 5,364,083 | 11/1994 | Ross et al. | 269/21 |
| 5,439,205 | 8/1995 | Haberle | 269/21 |
| 5,471,279 | 11/1995 | Takizawa | 269/21 X |
| 5,659,947 | 8/1997 | Eilers et al. | 29/740 |
| 5,670,009 | 9/1997 | Tarn et al. | 29/740 |
| 5,722,159 | 3/1998 | Stratas | 29/832 |

FOREIGN PATENT DOCUMENTS

| | | |
|---|---|---|
| 61-288490 | 12/1986 | Japan . |
| 294591 | 4/1990 | Japan . |

*Primary Examiner*—Peter Vo
*Assistant Examiner*—Rick Kiltae Chang
*Attorney, Agent, or Firm*—Leydig, Voit & Mayer

[57] ABSTRACT

A jig for dual-side mounting PC boards is composed of a board table which has a board supporting surface, a component receiving hole and a board sucking holes, spacers for placement in the component receiving holes, and a platform having a pressure-reducing space communicating with the board sucking holes. The spacers each have a protrusion for engagement with a spacer positioning hole made in the bottom of the component receiving hole.

22 Claims, 24 Drawing Sheets

A — A

A — A

B — B

A — A

FIG.6
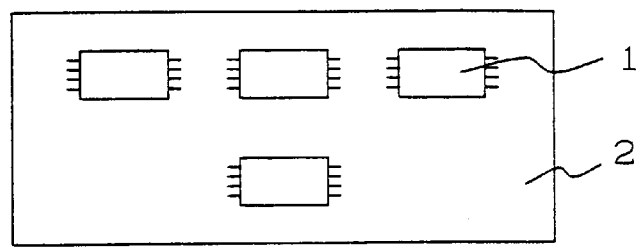
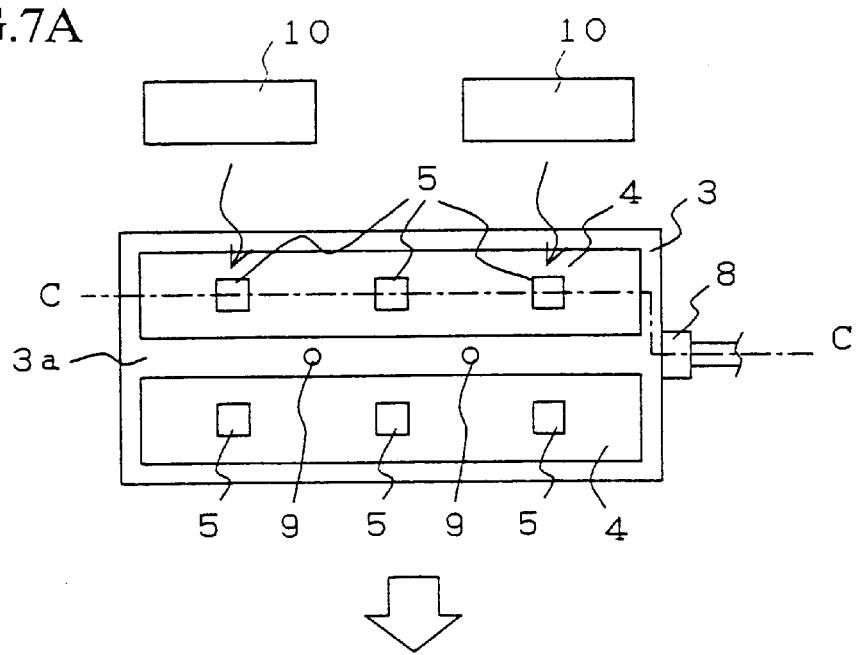
FIG.7A
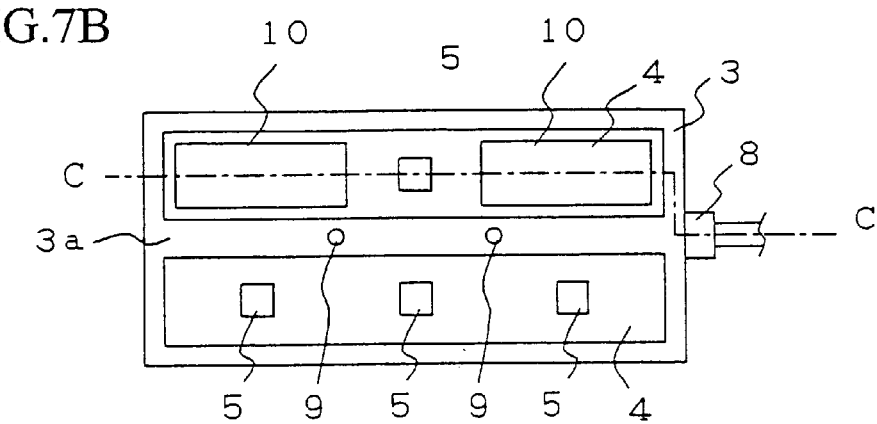
FIG.7B

D - D

D - D

D - D

E - E

G — G

G — G

H — H

H — H

G - G

J - J

K - K

J — J

L - L

M — M

N — N

L — L

M — M

O – O

P – P

Q – Q

O – O

P – P

JIG FOR DUAL-SIDE MOUNTING PC BOARDS

BACKGROUND OF THE INVENTION

1. Field of the Invention

The present invention relates to a jig for fixedly holding a dual-side mounting PC board on a board table by suction when mounting a component on one side of the PC board with components already mounted on the other side thereof.

2. Description of the Prior Art

FIG. 31 is a plan view showing a PC board with components of the same size mounted on one side thereof; FIG. 32 is a plan view showing a conventional jig for dual-side mounting PC boards; FIG. 33 is a sectional view taken on the line 33—33 in FIG. 32; FIG. 34 is a sectional view taken on the line 34—34 in FIG. 32; FIG. 35 is a sectional view taken on the line 35—35 in FIG. 32 for explaining how to fixedly hold the PC board by suction; FIG. 36 is a plan view showing another PC board of a different component mounting layout; FIG. 37 is a plan view showing another conventional jig for dual-side mounting PC board depicted in FIG. 36; FIG. 38 is a sectional view taken on the line 38—38 in FIG. 37; FIG. 39 is a sectional view taken on the line 39—39 in FIG. 37; FIG. 40 is a sectional view taken on the line 40—40 in FIG. 37; FIG. 41 is a sectional view taken on the line 38—38 in FIG. 37 for explaining how to fixedly hold the PC board by suction; FIG. 42 is a sectional view taken on the line 39—39 in FIG. 37 for explaining how to fixedly hold the PC board by suction; FIG. 43 is a plan view showing a PC board with components of different sizes mounted on one side thereof; FIG. 44 is a plan view showing another conventional jig corresponding to the PC board depicted in FIG. 43; FIG. 45 is a sectional view taken on the line 45—45 in FIG. 44; FIG. 46 is a sectional view taken on the line 46—46 in FIG. 44; FIG. 47 is a sectional view taken on the line 47—47 in FIG. 44; FIG. 48 is a sectional view taken on the line 45—45 in FIG. 44 for explaining how to fixedly hold the PC board by suction; FIG. 49 is a sectional view taken on the line 46—46 in FIG. 44 for explaining how to fixedly hold the PC board.

In the drawings, reference numeral 31 denotes surface mounting components of the same size mounted on a PC board 32; reference numeral 33 denotes a PC board table for supporting the PC board 32 on its top or board supporting surface 33a; reference numeral 34 denotes component receiving holes made in the board supporting surface 33a of the table 33 to receive the surface mounting components 31.

Reference numeral 36 denotes a platform for supporting the board table 33 mounted thereon, which is provided with an upwardly opening space 37 for vacuum suction and an evacuating port 38 that communicates with the vacuum-sucking space 37 and is connected to a vacuum pump or the like though not shown. When the PC board table 33 is placed on the platform 36, the vacuum-sucking space 37 forms a closed space, which is evacuated to a vacuum by the vacuum pump or the like via the evacuating port 38.

Reference numeral 39 denotes PC board sucking holes bored through the board table 33 and communicating with the vacuum-sucking space 37 as shown in FIGS. 34, 40 and 47.

Next, a description will be given first, with reference to FIGS. 35, 41 and 42, of the operation for fixing the PC board 32, shown in FIG. 31 and 36, to the board table 33 by suction.

In the first place, the PC board 32 is placed on the board table 33 with the surface mounting components 31 snugly received in the component receiving holes 34, the board sucking holes 39 being covered with the PC board 32.

As the vacuum-sucking space 37 is evacuated by a vacuum pump or the like connected to the evacuating port 38 of the platform 36, the pressure in the space 37 is reduced, and consequently, the PC board 32 is fixed to the top 33a of the board table 33 by the forces of attraction through the board sucking holes 39.

The underside areas of the PC board 32 where no components are mounted are supported by those areas of the table top 33 surrounding the component receiving holes 34. This prevents that when new components are mounted on the other side of the PC board 32 afterward, excessive pressure is applied to the already mounted components 31 or the PC board 32 is bent, often resulting in the breakage of the board 32 or lead wires.

Next, a description will be given, with reference to FIGS. 48 and 49, of fixing the PC board 32 of FIG. 43 to the board table 33 by suction.

The PC board 32 is placed on the board table 33 with components 31 and 31a snugly received in component receiving holes 34 and 34a and covers the board sucking holes 39. Then the PC board 32 is fixed to the board table 33 by suction in the same fashion as described above.

Also in this instance, the underside areas of the PC board 32 where no components are mounted are supported by those areas of the table top 33 surrounding the component receiving holes 34 and 34a. The subsequent mounting of components on the other side of the PC board 32 will not exert any excessive pressure to the already mounted components 31 and 31a nor will it bend the PC board 32 to such an extent as to break it or lead wires formed thereon.

Incidentally, the techniques for supporting dual-side mounting PC boards are disclosed in JP-A-2-94591 and a method for mounting components is set forth in JP-A-61-288490.

SUMMARY OF THE INVENTION

Since the conventional jigs for dual-side mounting PC boards have such constructions as described above, it is necessary that the board table 33 having the component receiving holes 31 and 31a be made for each different component mounting layout of the board 32 or different component size; accordingly, this is very time- and labor-consuming and hence is uneconomical.

Furthermore, since the board sucking holes 39 are bored through the board table 33 only centrally thereof due to limitations on the position where to provide the vacuum-sucking space 37, the forces of suction are produced in the vicinity of the center of the PC board 32 but cannot sufficiently be obtained near the marginal or peripheral portions of the PC board 32. This gives rise to a particularly serious problem in the case of a larger PC board for which the forces of suction are needed in the marginal areas of the board.

Even if a board table is fabricated which is provided with new board sucking holes so as to solve this problem, it is further necessary to make a platform 36 having a vacuum-sucking space 37 that corresponds to the new board table.

It is therefore an object of the present invention to provide a jig for dual-side mounting PC boards which has a board table that can easily be used in common to PC boards of different component mounting layouts or different component sizes.

Another object of the present invention is to provide a jig for dual-side mounting PC boards which has only one kind of platform but ensures production of the forces of suction in the vicinity of marginal edges of the PC boards.

Still another object of the present invention is to provide a jig for dual-side mounting PC boards which has a higher degree of flexibility in dealing with various component sizes and mounting layouts.

According to a first aspect of the present invention, there is provided a jig for dual-side mounting PC boards which comprises: a board table provided with a board supporting surface, component receiving holes and board sucking holes; spacers disposed in the component receiving holes; and a pressure-reducing (or evacuating) space that communicates with the board sucking holes.

According to a second aspect of the present invention, there is provided a jig for dual-side mounting PC boards which comprises: a board table provided with a board supporting surface, component receiving holes, board sucking holes and a board peripheral area sucking hole; spacers disposed in the component receiving holes; a platform having a pressure-reducing space communicating with the board sucking holes and formed inside the peripheral area sucking holes; a groove through which the peripheral area sucking hole communicates with the pressure-reducing space of the platform; and a vacuum leakage preventive block that blocks the peripheral area sucking hole and part of the groove for the maintenance of vacuum.

According to a third aspect of the present invention, the spacers have different sizes corresponding to those of the surface areas of PC boards where no components are mounted.

According to a fourth aspect of the present invention, the spacers each have a protrusion on the underside thereof and the component receiving holes each have a spacer positioning hole made in its bottom.

According to a fifth aspect of the present invention, the spacer positioning holes each have a hole communicating with the pressure-reducing space of the platform and the spacers each have a board sucking hole that communicates with the hole.

According to a sixth aspect of the present invention, the protrusion of each spacers is asymmetrical with respect to its axis of the direction in which it is protrusively provided on the underside of the spacer.

According to a seventh aspect of the present invention, the protrusion of each spacer is symmetrical with respect to the axis of the direction of protrusion.

According to an eighth aspect of the present invention, there is provided a jig for dual-side mounting PC boards which comprises: a board table provided with a board supporting surface, component receiving holes, board sucking holes and a board peripheral area sucking hole; a platform having pressure-reducing space communicating with the board sucking holes and formed inside the peripheral area sucking hole; a groove through which the peripheral area sucking hole communicates with the pressure-reducing space of the platform; and a vacuum leakage preventive block that blocks the peripheral area sucking hole and part of the groove for the maintenance of vacuum.

According to the first aspect of the invention, the jig of the above structure can be used for various types of PC boards without the necessity of changing the board table for each particular component mounting layout or component size of the PC board; thus, this sharply reduces the manufacturing costs of PC board assemblies.

According to the second aspect of the invention, the jig of the above structure can be used for various types of PC boards without the necessity of changing the platform for each particular component mounting layout or component size of the PC board and produces sufficient forces of suction over the peripheral area of the PC board.

According to the third aspect of the invention, since the spacers have different sizes corresponding to those of the surface areas of PC boards where no components are mounted, it is possible to deal with PC boards of different component mounting layouts or different component sizes with a higher degree of flexibility by selecting spacers of the required size for each board.

According to the fourth aspect of the invention, since the spacers each have a protrusion on the underside thereof and since the component receiving holes each have a spacer positioning hole in its bottom, spacers can easily be positioned and fixed.

According to the fifth aspect of the invention, since the spacer positioning holes each have a hole communicating with the pressure-reducing space of the platform and since the spacers each have a board sucking hole that communicates with the hole, the PC board can be sucked at the spacer portion as well; this provides for increased forces of suction.

According to the sixth aspect of the invention, since the protrusions of the spacers are each asymmetrical with respect to its axis in the direction of protrusion, the direction of their placement with respect to the board table is limited to one direction; this serves to prevent what is called "reverse insertion".

According to the seventh aspect of the invention, since the protrusions of the spacers are each symmetrical with respect to its axis in the direction of protrusion, it is possible to deal with various component sizes and component mounting layouts with a higher degree of flexibility by arbitrarily selecting the direction of placement of the spacers.

According to the eighth aspect of the invention, the jig of the above structure can be used for various types of PC boards without the necessity of changing the platform for each particular component mounting layout or component size of the PC board, and effectively produces sufficient forces of suction over the peripheral area of the PC board.

BRIEF DESCRIPTION OF THE DRAWINGS

FIG. 6 is a plan view illustrating a PC board of a different component mounting layout;

FIGS. 7A and 7B are plan views showing the states of a board table before and after components are mounted thereon, respectively;

DETAILED DESCRIPTION OF THE PREFERRED EMBODIMENTS

Embodiments of the present invention will hereinafter be described with reference to the accompanying drawings.
Embodiment 1

Figure 1:
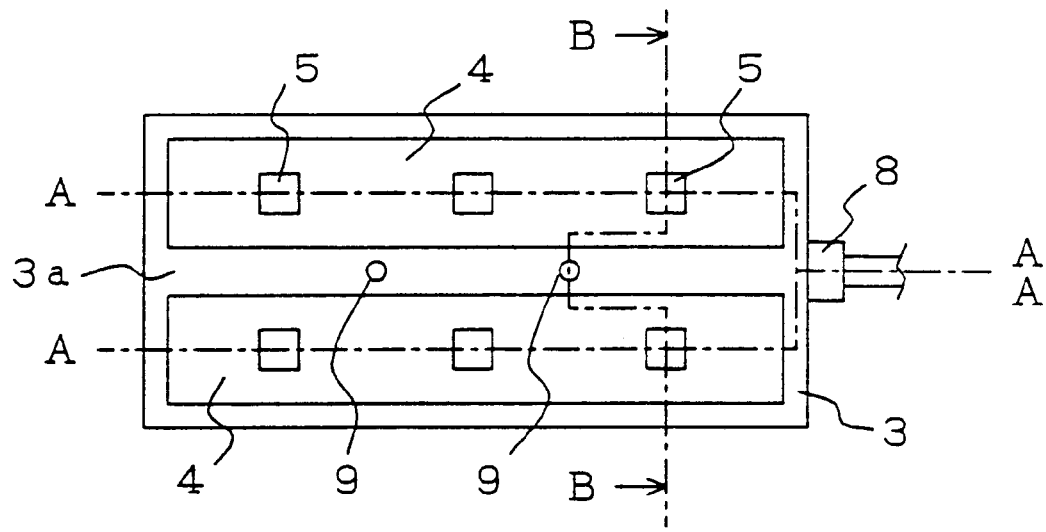
FIG. 1 is a plan view illustrating a jig for dual-side mounting PC boards according to a first embodiment of the present invention.
Figure 2:
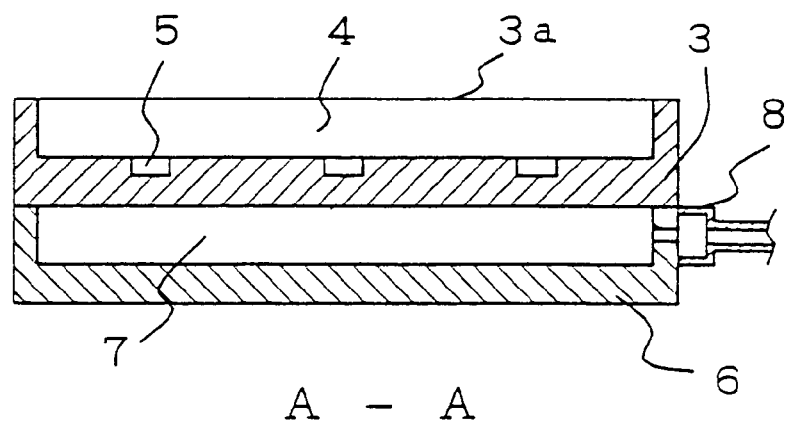
FIG. 2 is a sectional view taken on the line 2—2 in FIG. 1.
Figure 3:
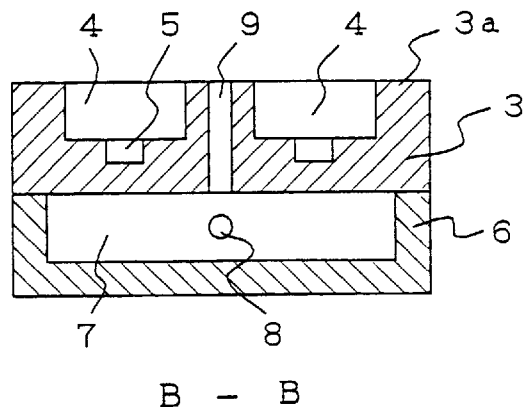
FIG. 3 is a sectional view taken on the line 3—3 in FIG. 1.
Figure 4:
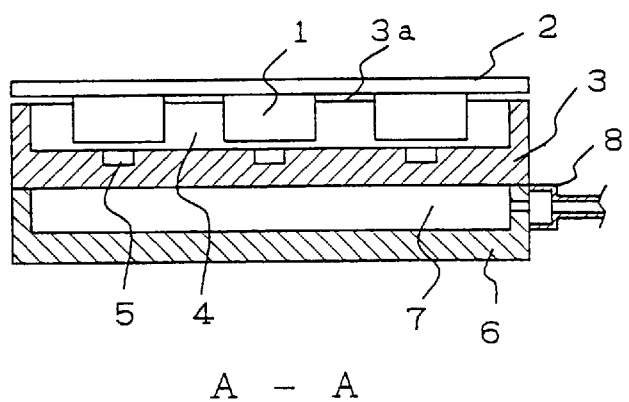
FIG. 4 is a sectional view taken on the line 4—4 in FIG. 1 for explaining how to fixedly hold a PC board by suction.
Figure 5:
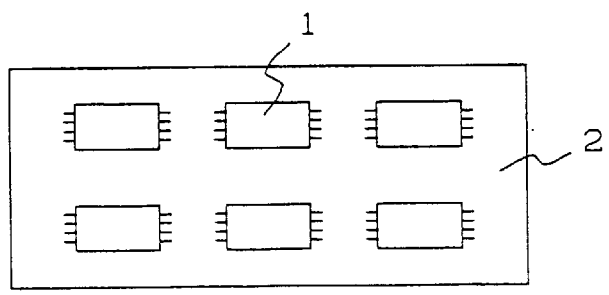
FIG. 5 is a plan view showing a PC board with components of the same size mounted thereon.
Figure 8A:
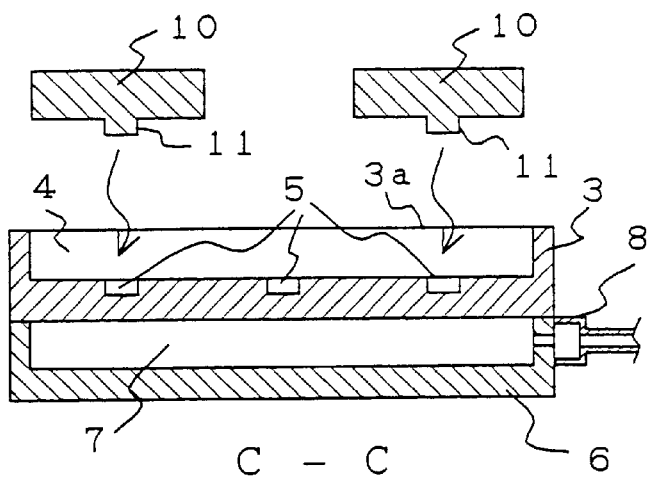
FIGS. 8A and 8B are sectional views taken on the lines 8A—8A and 8B—8B in FIGS. 7A and 7B, respectively.
Figure 8B:
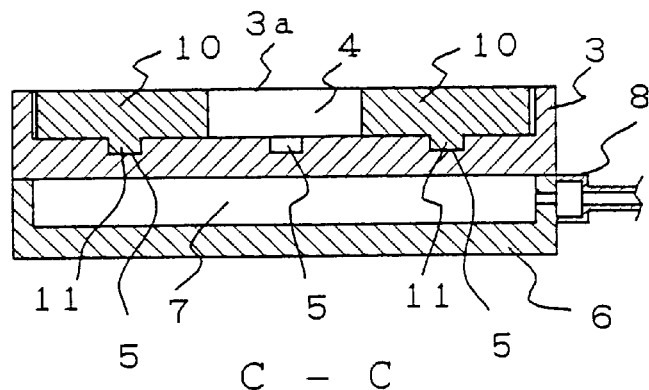
Figure 9:
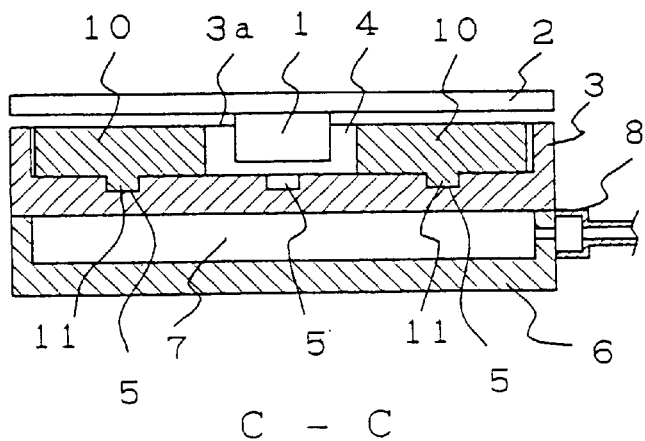
FIG. 9 is a sectional view taken on the line 8B—8B in FIG. 7B.

FIG. 1 is a plan view illustrating a jig for dual-side mounting PC boards according to a first embodiment of the present invention; FIG. 2 is a sectional view taken on the line 2—2 in FIG. 1; FIG. 3 is a sectional view taken on the line 3—3 in FIG. 1; FIG. 4 is a sectional view taken on the line 4—4 in FIG. 1 for explaining how to fixedly hold a PC board by suction; FIG. 5 is a plan view showing a PC board with components of the same size mounted thereon; FIG. 6 is a plan view illustrating a PC board of a different component mounting layout; FIGS. 7A and 7B are plan views showing the states of a board table with no spacers mounted thereon and with spacers mounted thereon, respectively; FIGS. 8A and 8B are sectional views taken on the lines 8A—8A and 8B—8B in FIGS. 7A and 7B, respectively; FIG. 9 is a sectional view taken on the line 8B—8B in FIG. 7B.

In FIGS. 5 and 6, reference numeral 1 denotes surface mounting components of the same size mounted on a PC board 2. In FIGS. 1 through 4, reference numeral 3 denotes a board table for supporting the PC board on its board supporting surface 3a and 4 a component receiving hole made in the table supporting surface 3a for loosely receiving the surface mounting components 1, the component receiving hole 4 having a depth slightly larger than the height of each component 1.

Reference numeral 5 denotes a plurality of square spacer positioning holes made in the bottom of each component receiving hole 4, for positioning therein spacers 10 as predetermined.

Reference numeral 6 denotes a platform for supporting the board table 3, which has an upwardly opening vacuum-sucking space 7 and an evacuating port 8 that communicates with the vacuum-sucking space 7 and is connected to a vacuum pump or the like (not shown). The outside shape of the platform 6 has the same size as that of the board table 3. When the board table 3 is placed on the platform 6, the vacuum-sucking space 7 forms a closed space, which is evacuated via the port 8 to a vacuum by the vacuum pump or the like (not shown).

Reference numeral 9 denotes board sucking holes bored through the board table 3 so that they communicate with the vacuum-sucking space 7.

In FIGS. 7A through 9, reference numeral 10 denotes spacers disposed in the component receiving hole 4 to support from beneath those surface areas of the PC board 2 where no components are mounted, each spacer 10 having a protrusion 11 from its underside for engagement with the spacer positioning hole 5. The protrusion 11 has a square form in its horizontal cross-section.

The thickness of the spacer 10 is chosen such that its top is flush with the table supporting surface 3$a$ of the board table 3 when the spacer 10 is received in the component receiving hole 4 with the protrusion 11 fitted in the spacer positioning hole 5 as shown in FIG. 8B.

Incidentally, the size and number of spacers 10 used and the positions and number of spacer positioning holes 5 are determined in accordance with the size of the component 1 to be mounted and component mounting layout of the PC board 3.

The operation will be next described.

A description will be given first, with reference to FIG. 4, of how the PC board 2 depicted in FIG. 5 is fixed to the board table 3 by suction.

In this instance, the PC board 2 has the components 1 mounted thereon densely and uniformly, and hence it is so hard-to-bend that the spacers 10 need not be disposed in the component receiving holes 4. The PC board 2 is placed on the board table 3 with the components 1 received in the component receiving holes 4 and covering the board sucking holes 9.

As the vacuum-sucking space 7 is evacuated by a vacuum pump or the like connected to the evacuating port 8 of the platform 6, the pressure in the space 7 is reduced, and consequently, the PC board 2 is fixed to the top 3$a$ of the board table 3 by the forces of attraction through the board sucking holes 9.

Since the underside areas of the PC board 2 where no components are mounted are supported by those areas of the table top 3 and the spacers 10, it is possible to effectively prevent that when new components are mounted on the other side of the PC board 2 afterward, excessive pressure is applied to the already mounted components 1 or the PC board 2 is bent, resulting in the breakage of the board 2 or lead wires.

Turning next to FIGS. 8A, 8B and 9, it will be described how the PC board 2 shown in FIG. 6 is fixed to the board table 3 by suction. In this case, the number of components mounted on the PC board 2 is smaller than in the case of FIG. 5.

In this instance, spacers 10 are put in the component receiving holes 4 at those positions corresponding to the areas of the PC board 2 where no components are mounted.

The spacers 10 each thus placed in the component receiving hole 4 have their protrusion 11 fitted in the spacer positioning hole 5.

After this, the PC board 2 is placed on the board table 3 and fixed thereto by suction in the same manner as described above.

The underside areas of the PC board 2 where no components are mounted are supported by those areas of the table top 3 surrounding the component receiving holes 4. This eliminates the possibility that when new components are mounted on the other side of the PC board 2 afterward, excessive pressure is applied to the already mounted components 1 or the PC board 2 is bent, often leading to the breakage of the board 2 itself or lead wires formed thereon.

As described above, the jig according to this embodiment can be used for PC boards of different component mounting layouts by properly placing the spacers 10 in the component receiving holes 4 accordingly. Hence, the jig of this embodiment avoids the necessity of fabricating board tables each corresponding to a different component mounting layout as in the prior art and is capable of dealing with various mounting layouts with one kind of board table 3 through utilization of the spacers 10 that can be made easily at low cost; this produces an effect of sharply cutting the fabrication costs of the PC board assemblies.

Embodiment 2

The jig of this embodiment is intended for use with dual-side mounting PC boards with components of different sized mounted thereon.

Figure 10A:
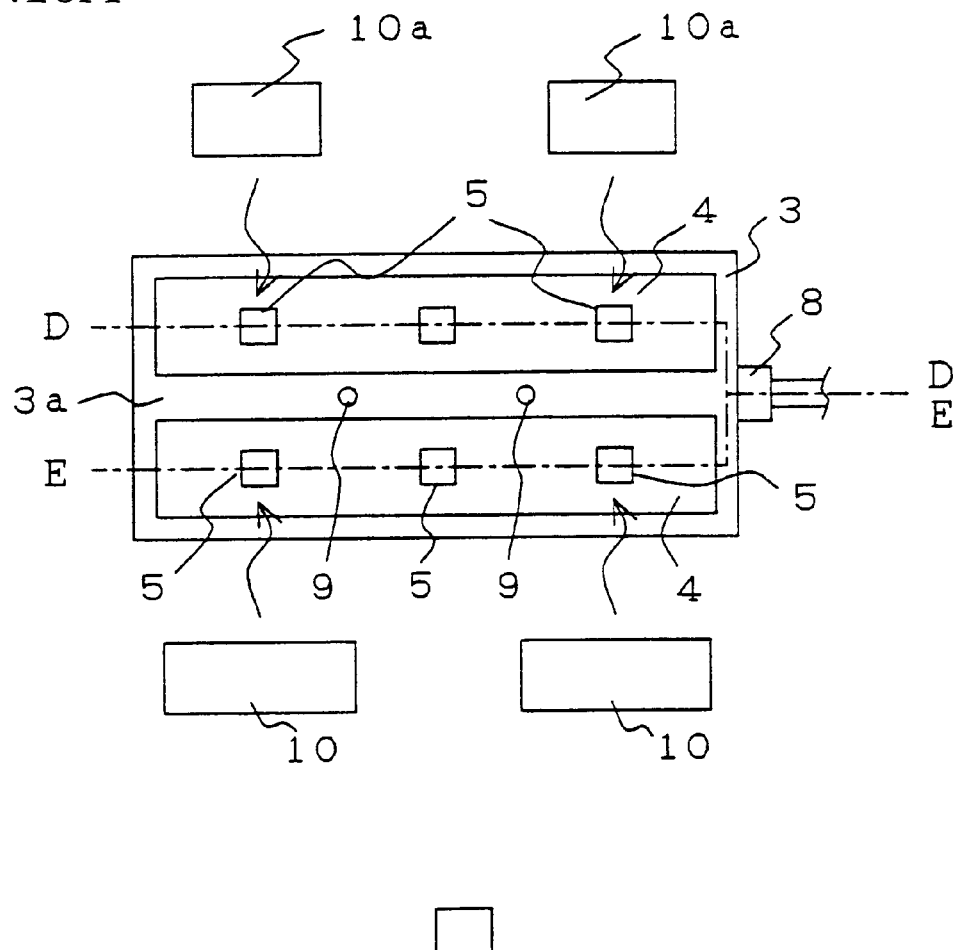
FIGS. 10A and 10B are plan views showing the states of a jig according to a second embodiment of the present invention before and after spacers are mounted on the board table, respectively.
Figure 10B:
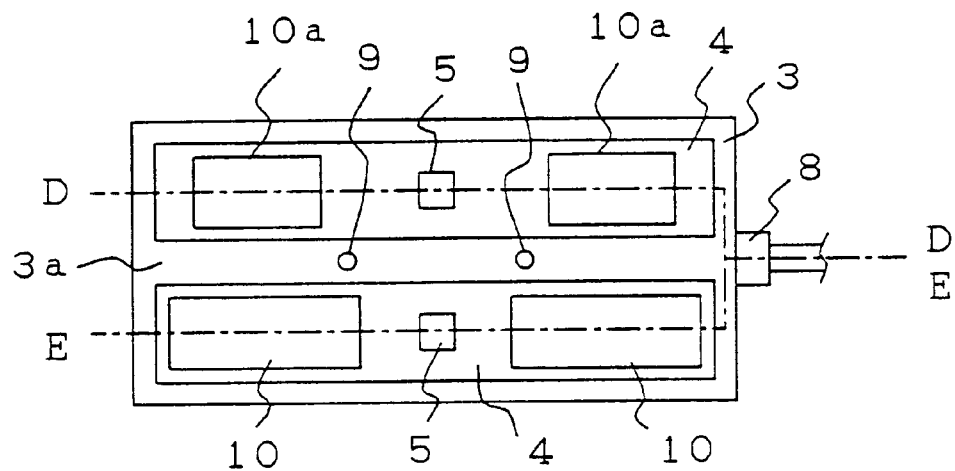
Figure 11A:
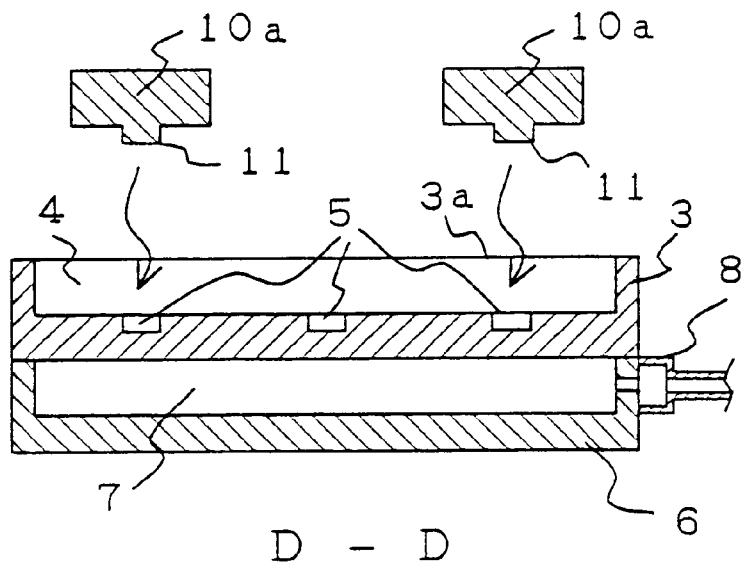
FIGS. 11A and 11B are sectional views taken on the lines 11A—11A and 11B—11B in FIGS. 10A and 10B, respectively.
Figure 11B:
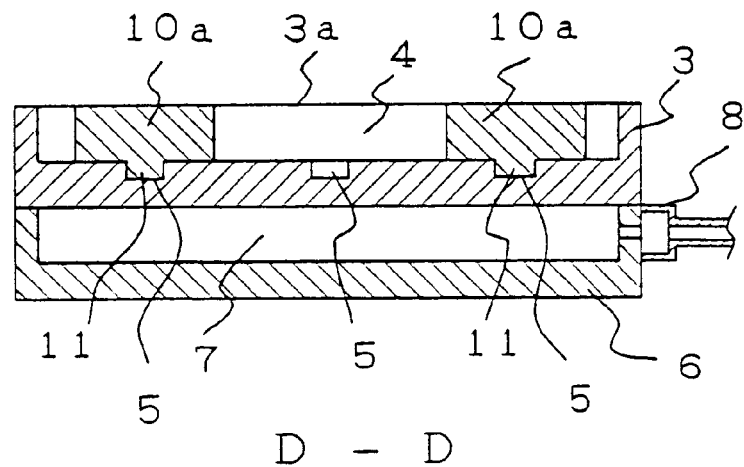
Figure 12A:
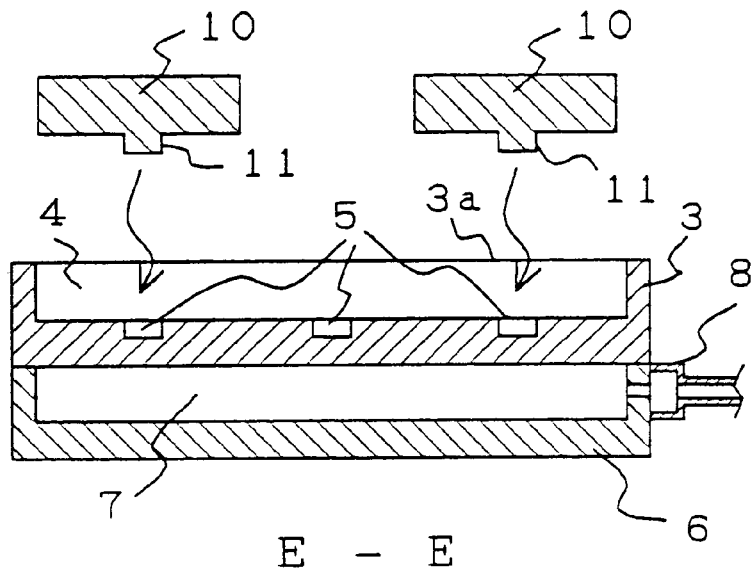
FIGS. 12A and 12B are sectional views taken on the lines 12A—12A and 12B—12B in FIGS. 10A and 10B, respectively.
Figure 12B:
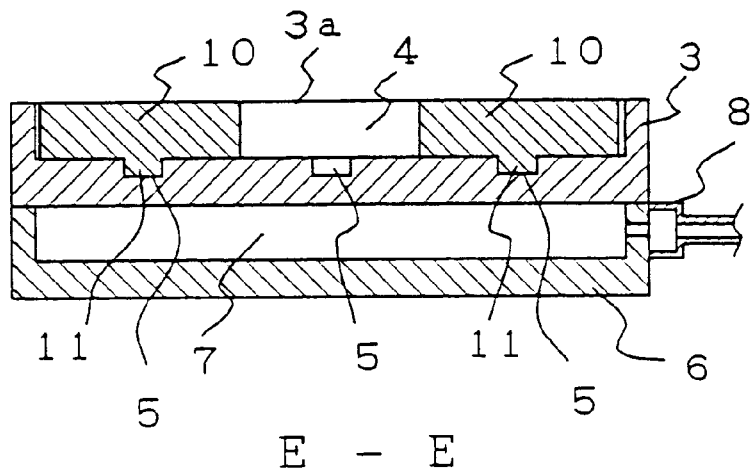
Figure 13:
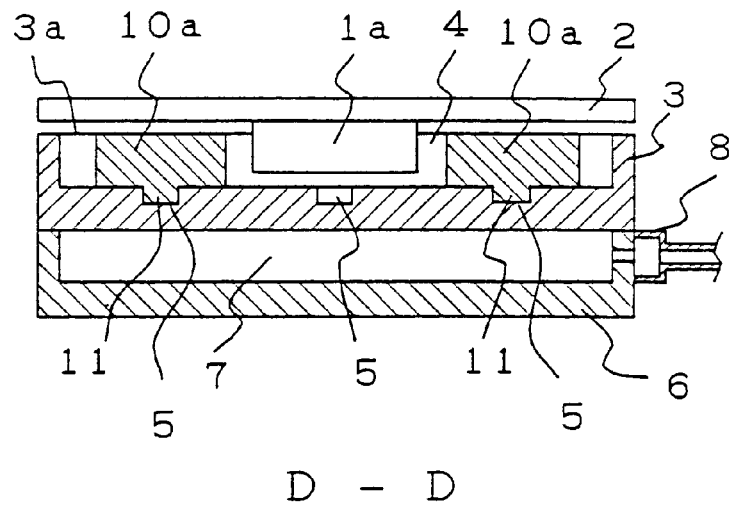
FIG. 13 is a sectional view taken on the line 11B—11B in FIG. 10B for explaining how to fixedly hold the PC board by suction.
Figure 14:
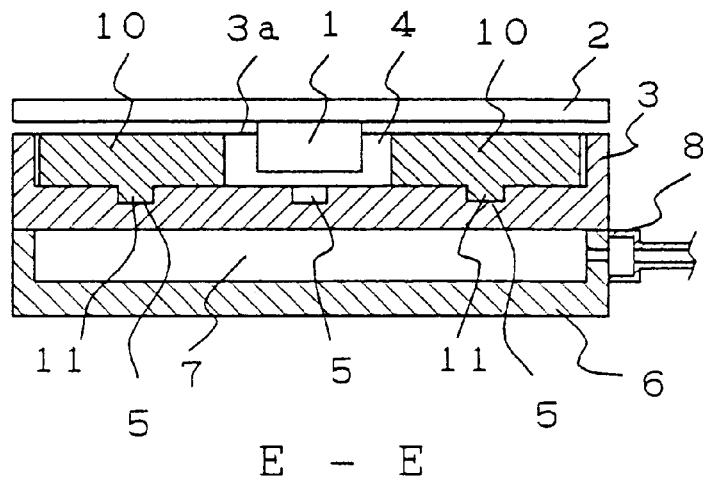
FIG. 14 is a sectional view taken on the line 12B—12B in FIG. 10B for explaining how to fixedly hold the PC board by suction.

FIGS. 10A and 10B are plan views showing the states of the jig of this embodiment before and after spacers are placed in the component receiving holes, respectively; FIGS. 11A and 11B are sectional views taken on the lines 11A—11A and 11B—11B in FIGS. 10A and 10B, respectively; FIGS. 12A and 12B are sectional views taken on the lines 12A—12A and 12B—12B in FIGS. 10A and 10B; FIG. 13 is a sectional view taken on the line 11B—11B in FIG. 10B for explaining how to fixedly hold the PC board by suction; FIG. 14 is a sectional view taken on the line 12B—12B in FIG. 10B for explaining how to fixedly hold the PC board by suction; and FIG. 15 is a plan view illustrating a PC board with components of different sizes mounted thereon.

The parts corresponding to those in Embodiment 1 are identified by the same reference numerals and no description will be repeated thereof.

Figure 15:
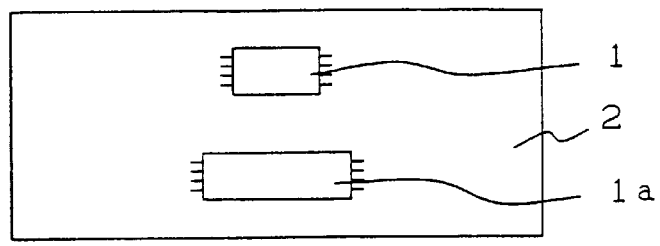
FIG. 15 is a plan view illustrating a PC board with components of different sizes mounted thereon.

In FIG. 15, reference numeral 1$a$ denotes a surface mounting component of a size larger than that of the component 1. In FIGS. 10A through 14, reference numeral 10$a$ denotes spacers placed in the component receiving holes 4, for supporting the PC board 2 from below at opposite areas across the components 1$a$. The spacers 10$a$ each have the protrusion 11 snugly fitted in the spacer positioning hole 5 made in the bottom of the component receiving hole 4. The spacers 10$a$ in this embodiment are made smaller than the spacers 10 for the purpose of supporting the PC board 2 at both sides of the component 1$a$ larger than that 1.

The operation will be next described.

The spacers 10 and 10$a$ are put in the component receiving holes 4 at positions opposite those areas of the PC board 2 which are contiguous to the opposite sides of the components 1 and 1$a$ when the PC board 2 is placed on the board table 3. In this case, the spacers 10 and 10$a$ are positioned by fitting their protrusions 11 into the spacer positioning holes 5 in the component receiving holes 4.

The PC board 2 is placed on the board table 3 with the components 1 and 1$a$ held in the component receiving holes 4 and covering the board sucking holes 9, and then the PC board 2 is fixed to the top 3a of the board table 3 by suction as is the case with Embodiment 1.

The underside areas of the PC board 2 where no components are mounted are supported by those areas of the table top 3 and the spacers 10 and 10a. Thus, when new components are mounted on the other side of the PC board 2 afterward, no excessive pressure is applied to the already mounted components 1 and 1a nor does the PC board 2 bend; namely, this structure ensures the protection of the board 2 or lead wires formed thereon.

As described above, the jig according to this embodiment can be used for PC boards with components of different sizes by placing the spacers 10 and 10a in the component receiving holes 4 accordingly. Hence, the jig of this embodiment avoids the necessity of fabricating board tables each corresponding to a different component size as in the prior art and is capable of dealing with PC boards having components of various sizes with one kind of board table 3 through utilization of the spacers 10a that can be made easily at low cost; this sharply cuts the fabrication costs of the PC board assemblies.

Embodiment 3

The jig of this embodiment is capable of fixing the PC board to the board table by suction even at spacer portions.

Figure 16A:
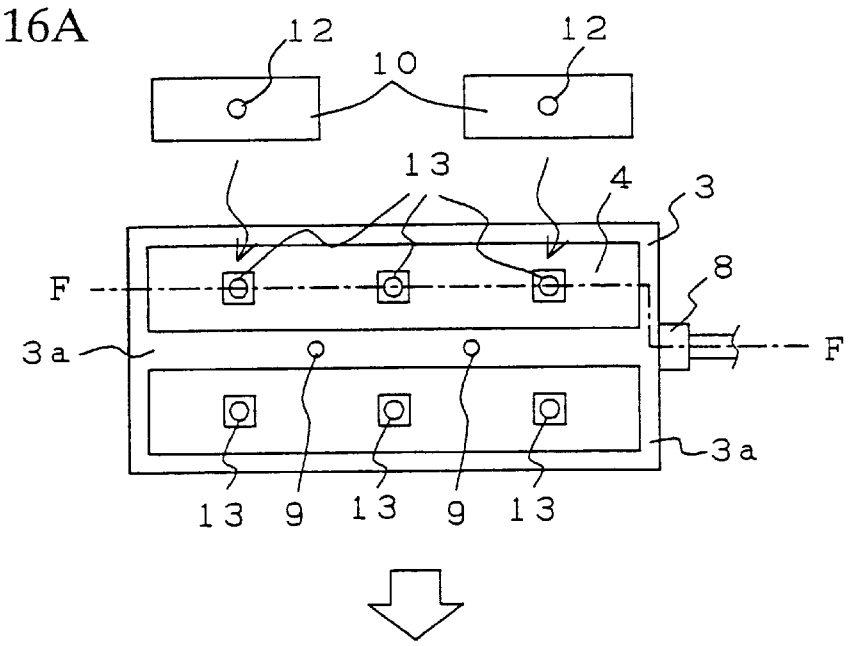
FIGS. 16A and 16B are plan views showing the states of a jig according to a third embodiment of the present invention before and after spacers are mounted on the board table, respectively.
Figure 16B:
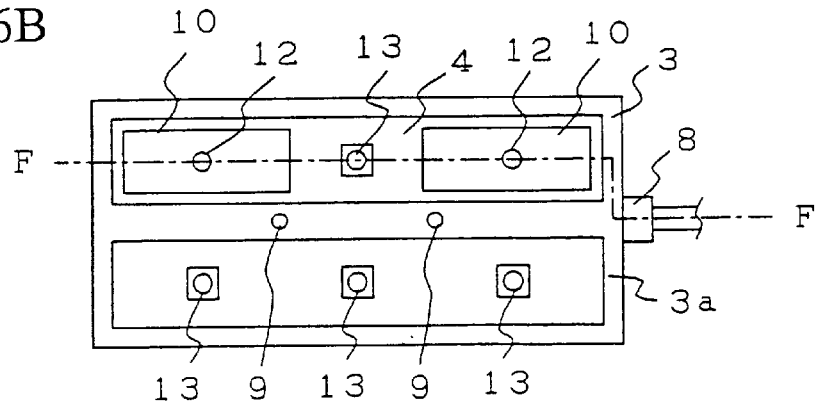
Figure 17A:
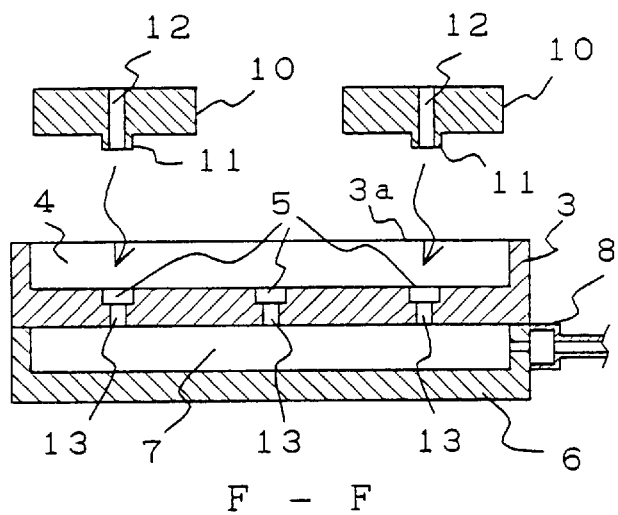
FIGS. 17A and 17B are sectional views taken on the lines 17A—17A and 17B—17B in FIGS. 16A and 16B, respectively.
Figure 17B:
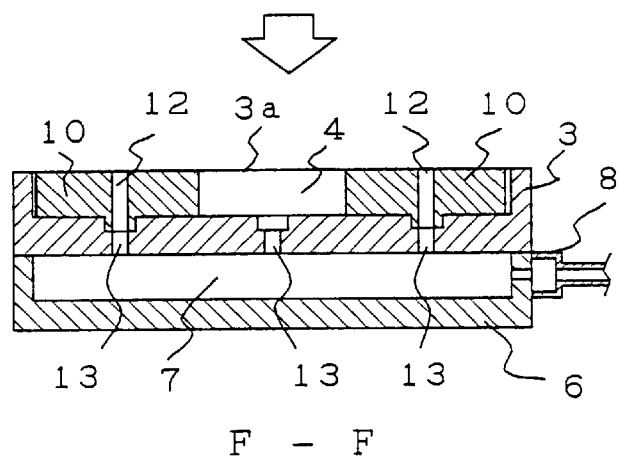
Figure 18:
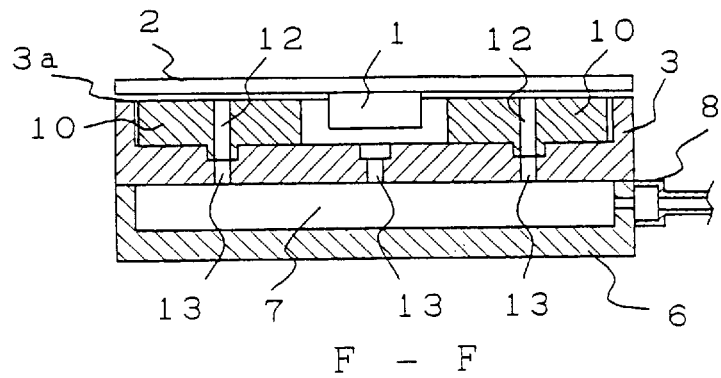
FIG. 18 is a sectional view taken on the line 17B—17B in FIG. 16B for explaining how to fixedly hold the PC board by suction.

FIGS. 16A and 16B are plan views showing the states of the jig according to this embodiment before and after spacers are placed in the component receiving holes, respectively; FIGS. 17A and 17B are sectional views taken on the lines 17A—17A and 17B—17B in FIGS. 16A and 16B, respectively; FIG. 18 is a sectional view taken on the line 17B—17B in FIG. 16B for explaining how to fixedly hold the PC board by suction.

In this embodiment the parts corresponding to those in Embodiment 1 are identified by the same reference numerals and no description will be repeated thereof.

In FIGS. 16A through 18, reference numeral 12 denotes a board sucking hole bored through each spacer 10 and its protrusion 11; reference numeral 13 denotes a through hole through which each spacer positioning hole 5 communicates with the vacuum-sucking space 7.

The operation will be next described.

As the vacuum-sucking space 7 is evacuated by a vacuum pump or the like connected to the evacuating port 8 of the platform 6, the pressure in the space 7 is reduced, and consequently, the PC board 2 is fixed to the top 3a of the board table 3 by the forces of attraction through the through holes 13, the board sucking holes 12 and the board sucking holes 9 that communicate with the vacuum-sucking space 7. That is, the PC board 2 is vacuum-sucked through the holes 12 as wells as those 9, and hence it is fixed by suction more firmly than in the case of Embodiment 1.

As described above, the jig of this embodiment not only produces the same effects as are obtainable with the jig of Embodiment 1 but also produces the effect of fixing the PC board to the board table by suction more firmly than in the case of Embodiment 1.

While in the above the suction holes 12 are described to extend through the spacers 10, they may similarly be bored through the spacers 10a in embodiment 2 as well, in which case the PC board 2 with components of different sizes mounted thereon can be fixed by suction more firmly.

Embodiment 4

The jig of this embodiment is intended to ensure fixing the peripheral areas of large PC boards by suction.

Figure 19:
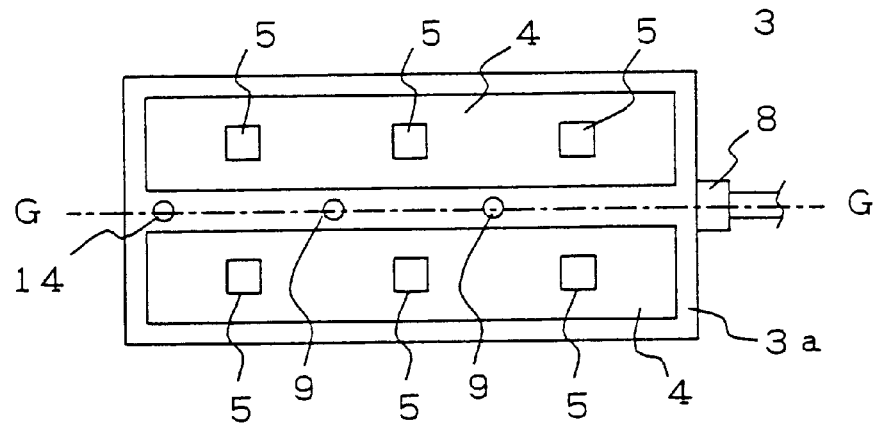
FIG. 19 is a plan view illustrating a jig for dual-side mounting PC boards according to a fourth embodiment of the present invention.
Figure 20A:
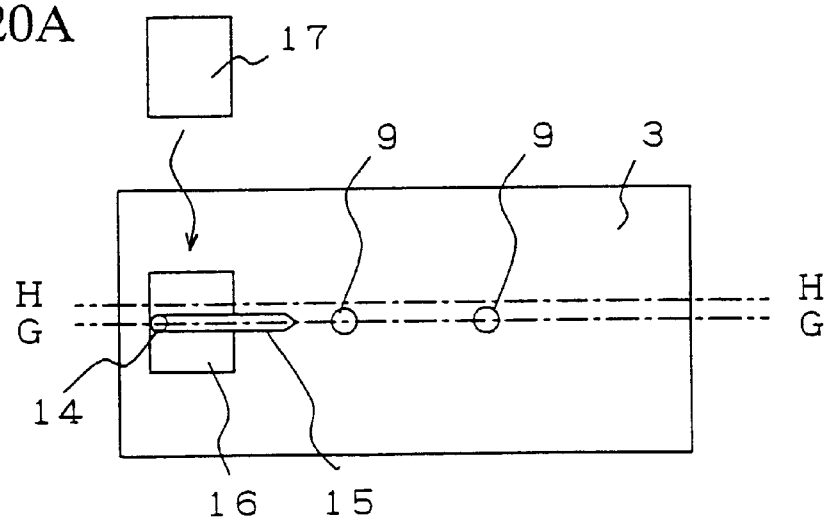
FIGS. 20A and 20B are bottom views of the jig showing its state before and after a vacuum leakage preventive block is disposed in the board table.
Figure 20B:
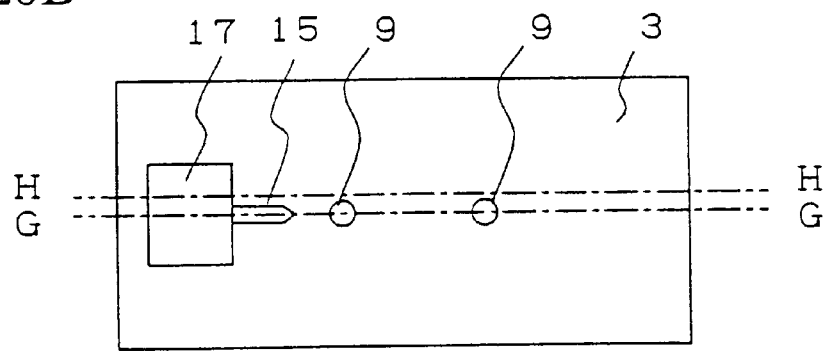
Figure 21A:
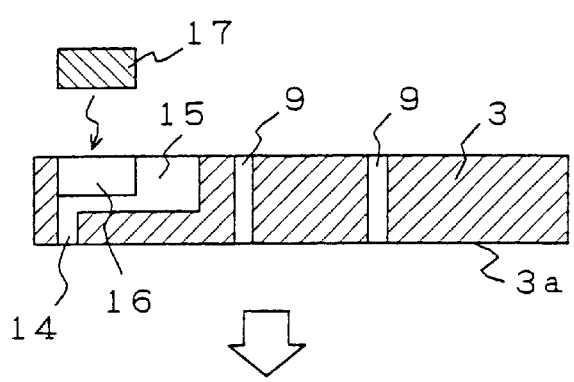
FIGS. 21A and 21B are sectional views taken on the lines 21A—21A and 21B—21B in FIGS. 20A and 20B, respectively.
Figure 21B:
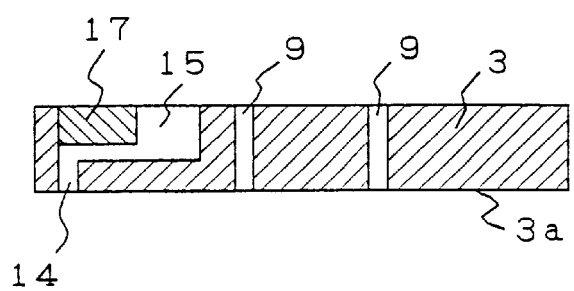
Figure 22A:
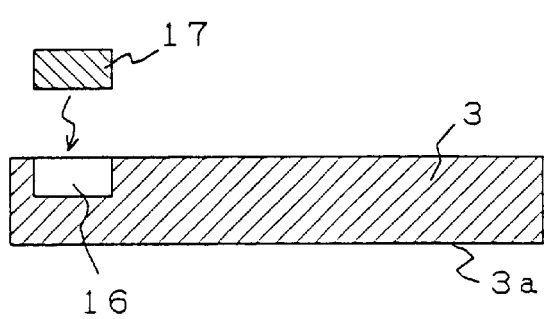
FIGS. 22A and 22B are sectional views taken on the lines 22A—22A and 22B—22B in FIGS. 20A and 20B, respectively.
Figure 22B:
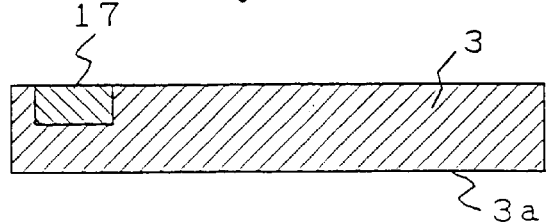
Figure 23:
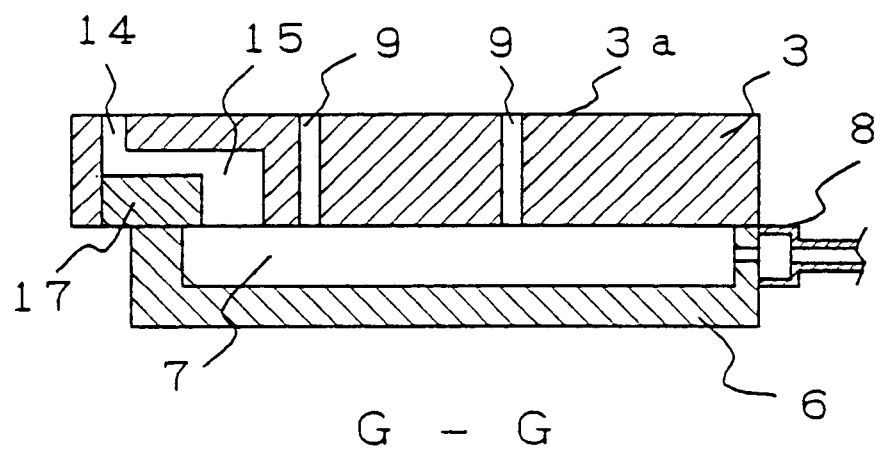
FIG. 23 is a sectional view taken on the line 23—23 in FIG. 19.
Figure 24:
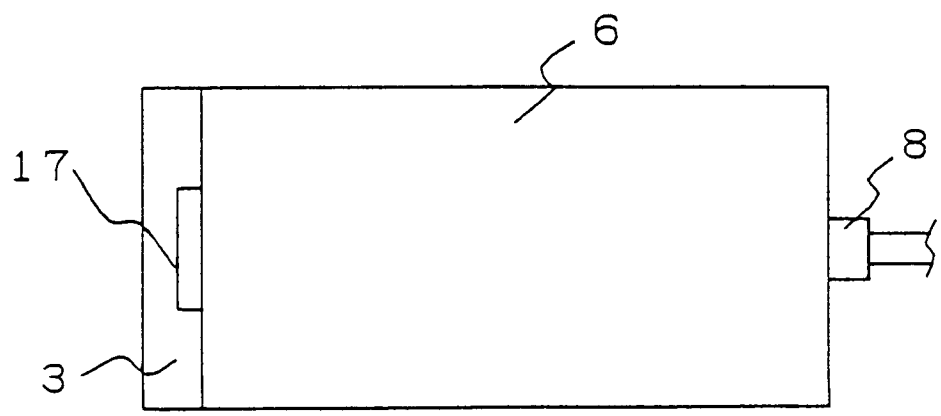
FIG. 24 is a bottom view of the jig depicted in FIG. 19.

FIG. 19 is a plan view illustrating the jig according to this embodiment; FIGS. 20A and 20B are bottom views of the jig showing its state before and after a vacuum leakage preventive block is mounted in the board table, respectively; FIGS. 21A and 21B are sectional views taken on the lines 21—21 in FIGS. 20A and 20B; FIGS. 22A and 22B are sectional views taken on the lines 22—22 in FIGS. 20A and 20B; FIG. 23 is a sectional view taken on the line 23—23 in FIG. 19; FIG. 24 is a bottom view of the jig depicted in FIG. 19.

In this embodiment, the parts corresponding to those in Embodiment 1 are identified by the same reference numerals and no description will be repeated thereof.

Reference numeral 3 denotes a board table, which is made wider than the board table 3 in Embodiment 1 with a view to fixing thereto by suction PC boards wider than that in Embodiment 1.

On the other hand, the platform 6 has the same size as in Embodiment 1. Accordingly, the board table 3 mounted on the platform 6 extends out laterally more than the latter.

Reference numeral 14 denotes a through hole extending through the board table 3 near one marginal edge thereof and at a position outside the vacuum-sucking space 7 of the platform 6 so as to fixedly hold the peripheral area of the PC board (not shown).

Reference numeral 15 denotes a groove cut in the underside of the board table 3 and open to the vacuum-sucking space 7 of the platform 6 so that the hole 14 and the space 7 communicate with each other through the groove 15.

Reference numeral 16 denotes a recess (which forms part of each of the hole 14 and the groove 15) made in the underside of the board table 3 at a position opposite one end portion of the platform 6. A vacuum leakage preventive block 17 is fitted into the recess 16 so as to prevent a vacuum leakage which would otherwise be caused by partial exposure of the hole 14 and the groove 15 to the outside of the platform 6 when the board table 3 is placed thereon.

The jig of this embodiment is identical in construction with that of embodiment 1 except the above.

Since the basic procedure of this embodiment is the same as in Embodiment 1, a description will be given of their differences.

After the vacuum leakage preventive block 17 is fitted into the recess 16, the board table 3 is placed on the platform 6.

As the vacuum-sucking space 7 is evacuated to a vacuum by a vacuum pump or the like (not shown) connected to the evacuating port 8, the pressure in the space 7 is reduced and the peripheral portion of the PC board (not shown) is fixed to the top 3a of the board table 3 through the groove 15 and the hole 14 that communicate with the space 7.

Further, the vacuum leakage preventive block 17 snugly received in the recess 16 keeps part of each of the hole 14 and the groove 15 from exposure to the outside of the platform 6, allowing ease in preventing a vacuum leakage.

As described above, the jig of this embodiment not only produces the same effects as are obtainable with the jig of Embodiment 1 but also ensures fixing of the peripheral portion of an upsized PC board by suction. To this end, only the board table 3 needs to be fabricated separately but the platform 6 can be used regardless of the size of the PC board to be placed thereon.

While the jig of this embodiment is identical in construction with the jig of Embodiment 1 except the above, it is also possible to employ the construction of Embodiment 2 or 3 in combination with that of this embodiment.

Besides, the board table 33 described previously with respect to the prior art may also be adapted to include the hole 14, the groove 15, the recess 16 and the vacuum leakage block 17. Such a structure ensures fixing of the peripheral portion of the PC board and permits the use of the platform 6 regardless of the size of the PC board as well as produces the same effects as those obtainable with the prior art.

Embodiment 5

In this embodiment the spacer 10 has an asymmetrical protrusion from the underside thereof and the spacer positioning hole in the board table is also asymmetrical correspondingly with a view to restricting the direction of placement of the spacers.

Figure 25A:
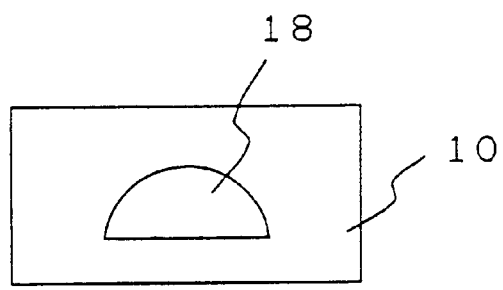
FIGS. 25A and 25B are a bottom and a side view of a spacer of the jig according to a fifth embodiment, respectively.
Figure 25B:
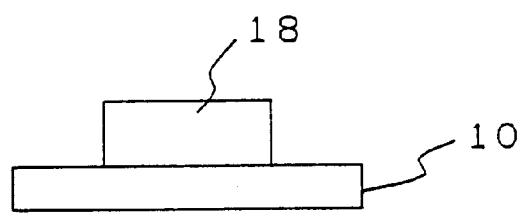
Figure 26:
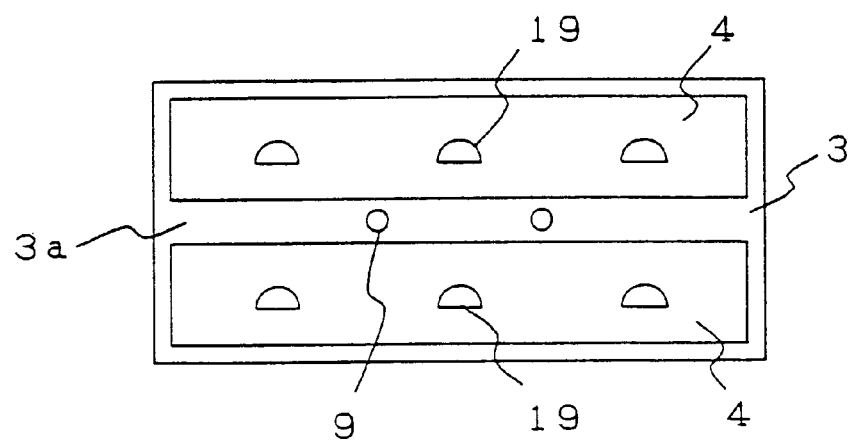
FIG. 26 is a plan view showing a board table adapted for use with such spacers shown in FIGS. 25A and 25B.
Figure 27A:
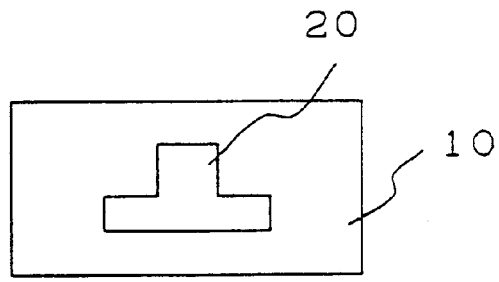
FIGS. 27A and 27B are a bottom and a side view showing a spacer of a different shape, respectively.
Figure 27B:
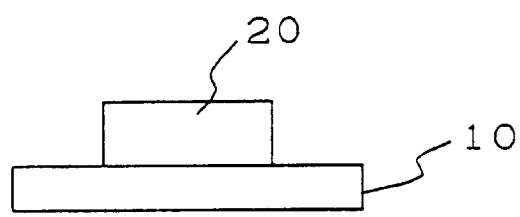
Figure 28:
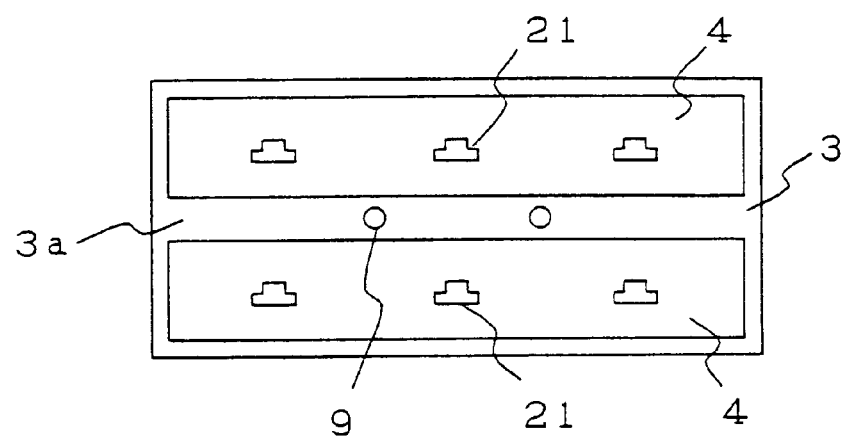
FIG. 28 is a plan view showing a board table adapted for use with such spacers shown in FIGS. 27A and 28B.

FIGS. 25A and 25B are a bottom and a side view of a spacer of the jig according to this embodiment, respectively; FIG. 26 is a plan view showing a board table adapted for use with such spacers shown in FIGS. 25A and 25B; FIGS. 27A and 27B are a bottom and a side view showing a spacer of a different shape, respectively; FIG. 28 is a plan view showing a board table for use with such spacers as shown in FIGS. 27A and 28B.

In this embodiment, the parts corresponding to those in Embodiment 1 are identified by the same reference numerals and no description will be repeated thereof.

In FIGS. 25A and 25B, reference numeral 18 denotes a protrusion from the underside of the spacer, which is semicircular in horizontal cross-section. In FIG. 26, reference numeral 19 denotes a plurality of spacer positioning holes made in the component receiving holes 4 to receive the protrusions 18 of the spacers 10 for positioning them. The spacer positioning holes 19 each have a semicircular horizontal cross-section for engagement with the protrusion 10 of the spacer 10.

FIGS. 27A and 27B illustrate a modified form of the spacer 10. Reference numeral 20 denotes a protrusion from the underside of the spacer 10, which is substantially T-shaped in horizontal cross-section.

In FIG. 28, reference numeral 21 denotes a plurality of spacer positioning holes made in the bottoms of the component receiving holes 4 for positioning therein the spacers 10. Also in this instance, the spacer positioning holes 21 each have a T-shaped horizontal cross-section for engagement with the protrusion 20 of the spacer 10.

The operation will be next described.

The other parts of this embodiment are identical with those of Embodiment 1, and hence no description will be given of them.

This embodiment differs from Embodiment 1 in that the protrusions 18 or 20 of the spacers 10 and the spacer positioning hole 19 or 21 are each formed asymmetrical with respect to its axis in the direction of projection so that the direction of placement of the spacers 10 is limited to one direction.

With such a structure, the jig of this embodiment produces an effect of preventing what is called "reverse insertion", in addition to the same effects as those obtainable with Embodiment 1.

Incidentally, the application of the spacers 10 with the protrusion 18 or 20, shown in this Embodiment 5, to Embodiments 2 through 4 will prevent the reverse insertion of the spacers 10 as well as obtain the same effects as those by the respective embodiments.

Embodiment 6

The jig of this embodiment is designed so that the spacers 10 are placed in the component receiving holes 4 at an angle of 45 degrees thereto in the horizontal direction.

Figure 29A:
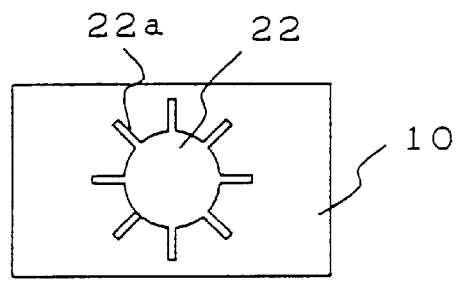
FIGS. 29A and 29B are a bottom and a side view illustrating a spacer of a jig for dual-side mounting PC boards according to a sixth embodiment.
Figure 29B:
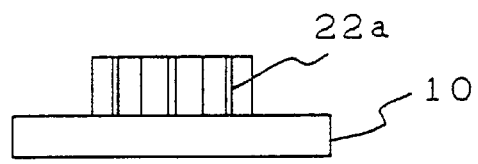
Figure 30A:
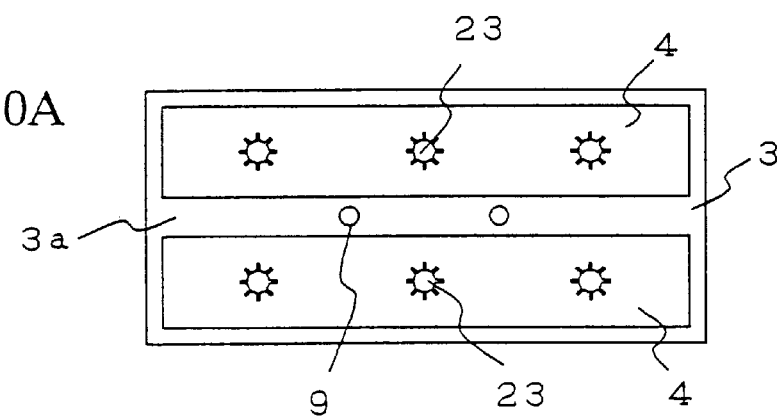
FIGS. 30A and 30B are plan views showing the states of the jig before and after spacers are mounted on the board table, respectively.
Figure 30B:
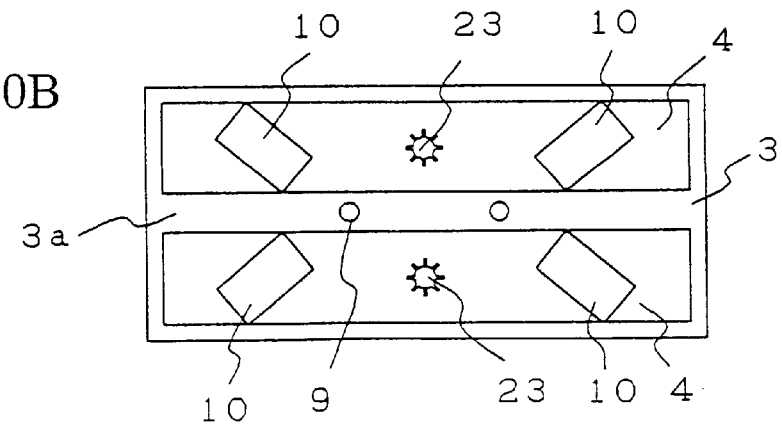
Figure 31:
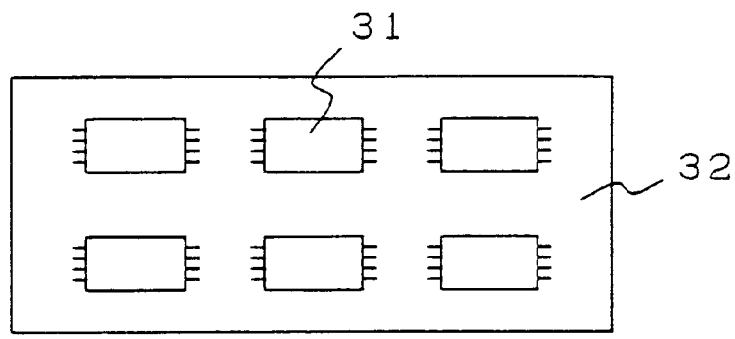
FIG. 31 is a plan view showing a PC board with components of the same size mounted on one side thereof.
Figure 32:
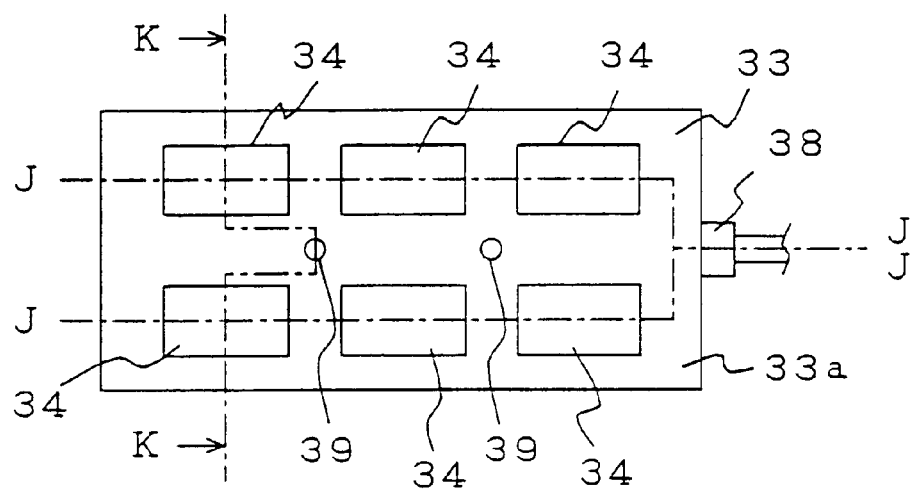
FIG. 32 is a plan view showing a conventional jig for dual-side mounting PC boards.
Figure 33:
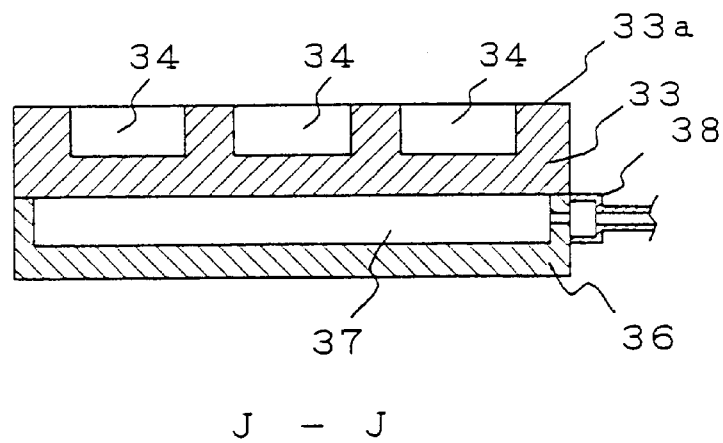
FIG. 33 is a sectional view taken on the line 33—33 in FIG. 32.
Figure 34:
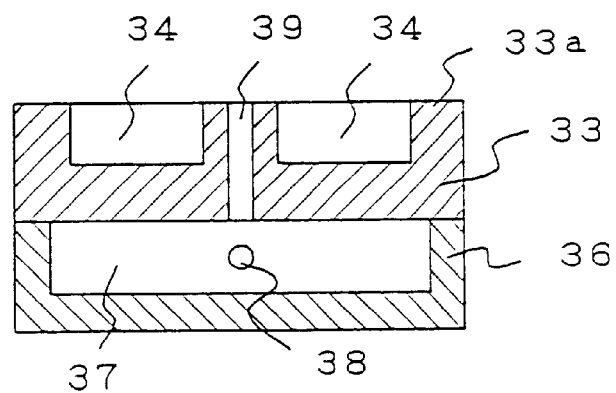
FIG. 34 is a sectional view taken on the line 34—34 in FIG. 32.
Figure 35:
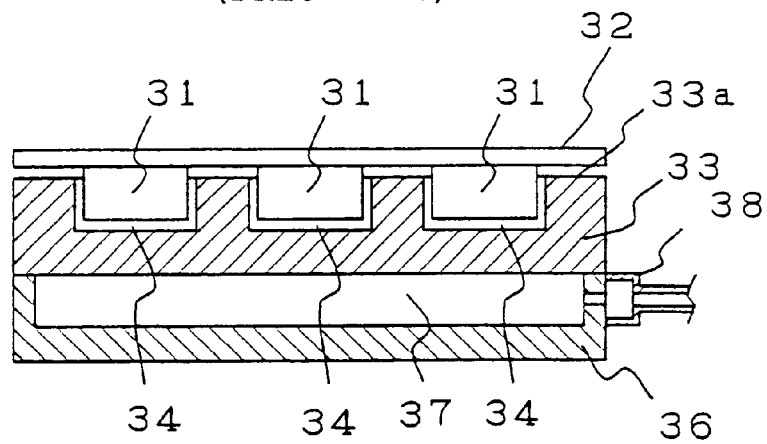
FIG. 35 is a sectional view taken on the line 35—35 in FIG. 32 for explaining how to fixedly hold the PC board by suction.
Figure 36:
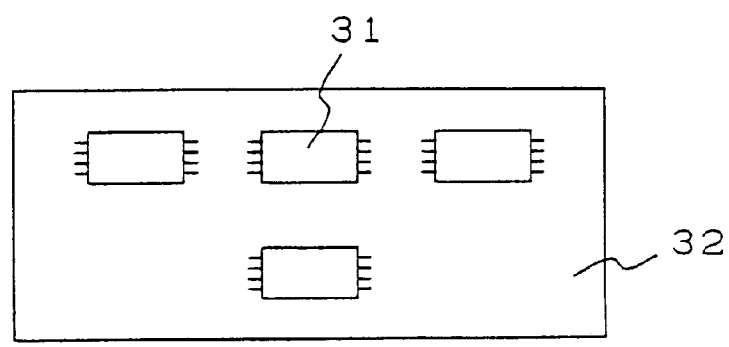
FIG. 36 is a plan view showing another PC board of a different component mounting layout.
Figure 37:
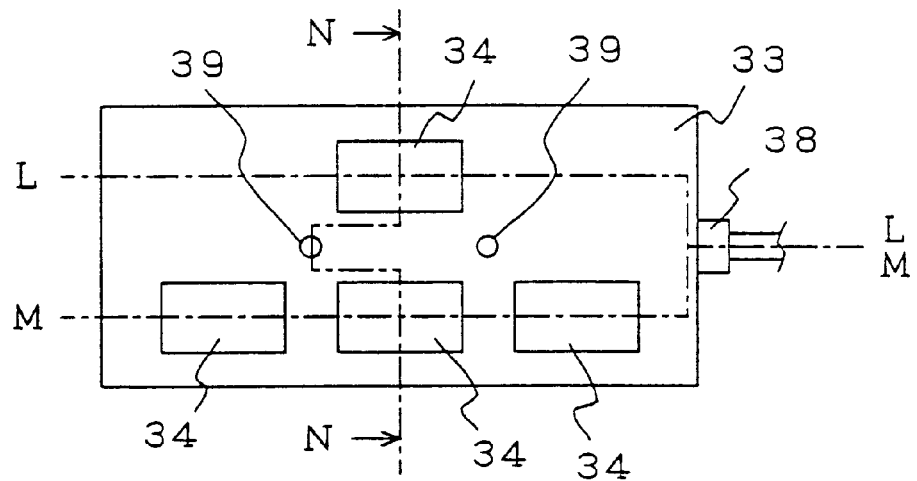
FIG. 37 is a plan view showing another conventional jig for the dual-side mounting PC board depicted in FIG. 36.
Figure 38:
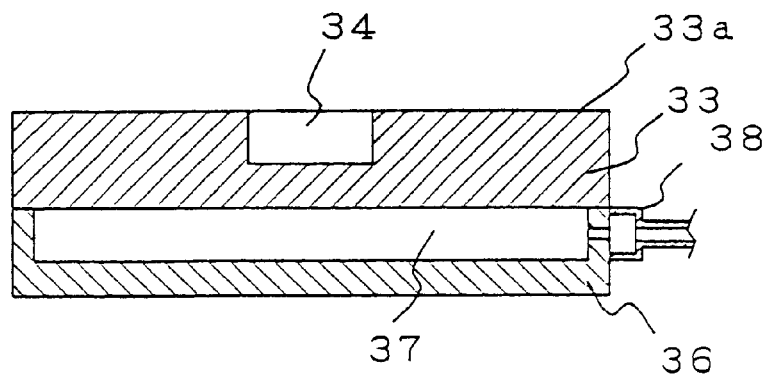
FIG. 38 is a sectional view taken on the line 38—38 in FIG. 37.
Figure 39:
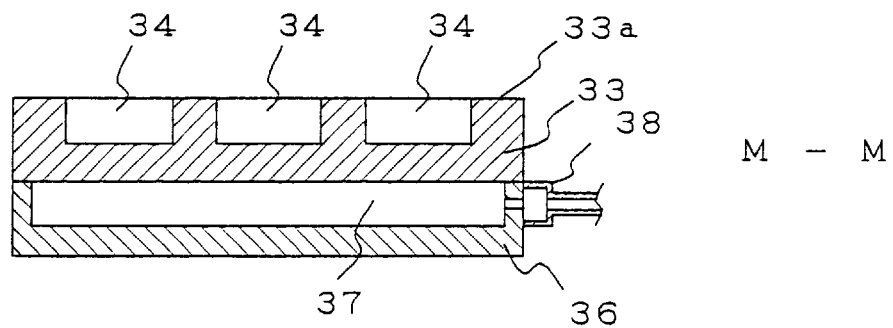
FIG. 39 is a sectional view taken on the line 39—39 in FIG. 37.
Figure 40:
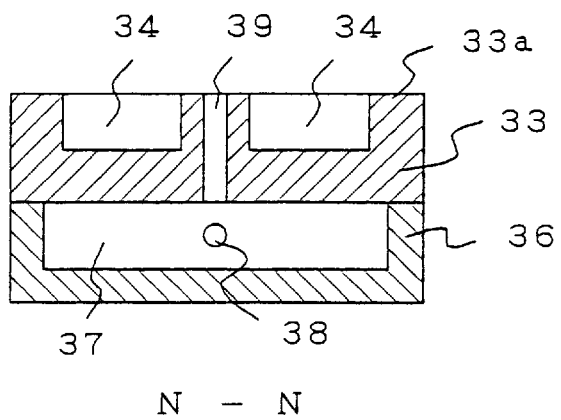
FIG. 40 is a sectional view taken on the line 40—40 in FIG. 37.
Figure 41:
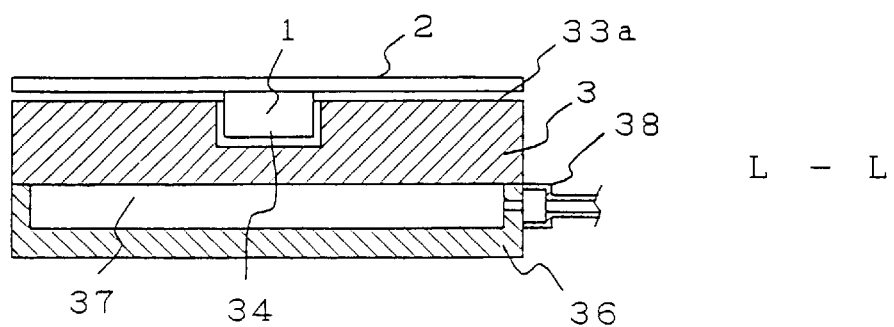
FIG. 41 is a sectional view taken on the line 38—38 in FIG. 37 for explaining how to fixedly hold the PC board by suction.
Figure 42:
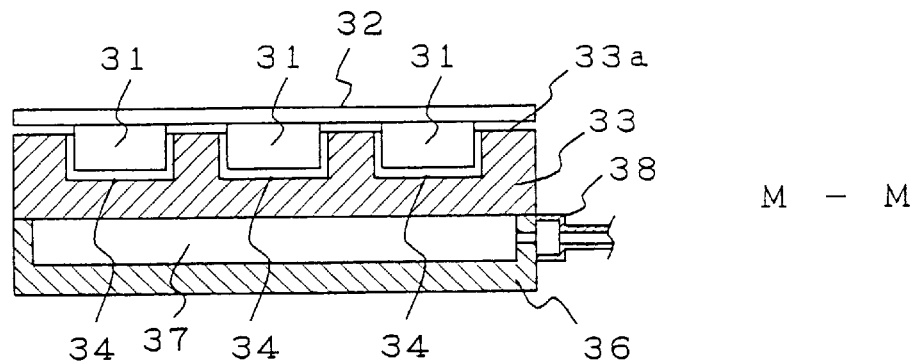
FIG. 42 is a sectional view taken on the line 39—39 in FIG. 37 for explaining how to fixedly hold the PC board by suction.
Figure 43:
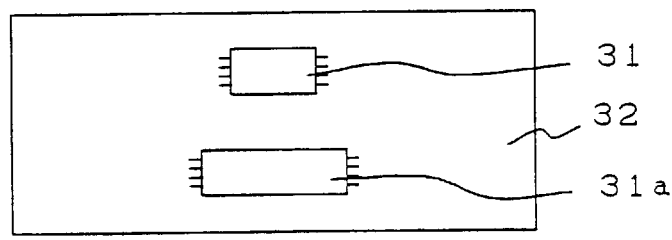
FIG. 43 is a plan view showing a PC board with components of different sizes mounted on one side thereof.
Figure 44:
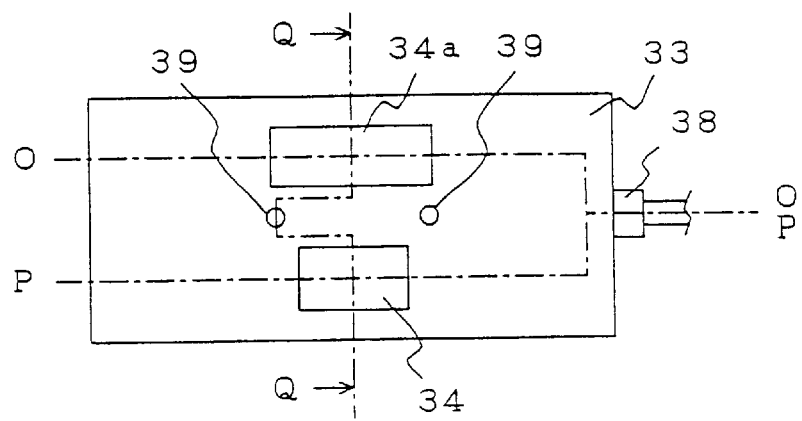
FIG. 44 is another conventional jig for the PC board depicted in FIG. 43.
Figure 45:
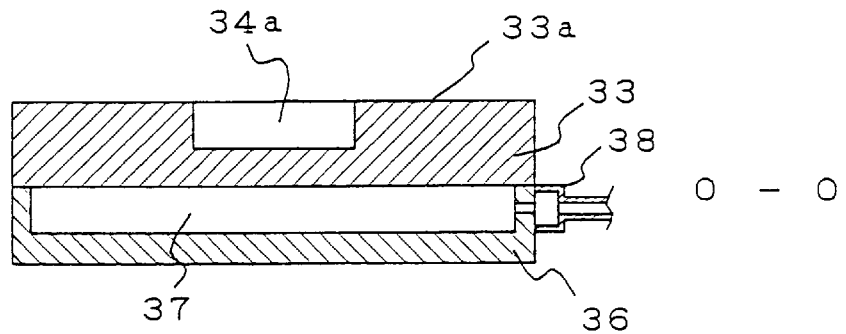
FIG. 45 is a sectional view taken on the line 45—45 in FIG. 44.
Figure 46:
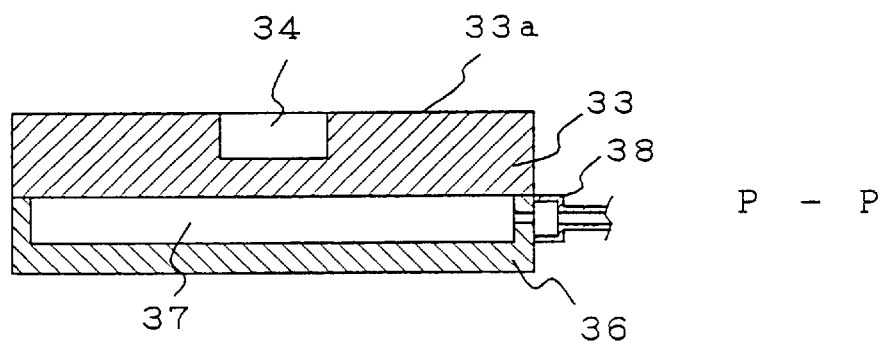
FIG. 46 is a sectional view taken on the line 46—46 in FIG. 44.
Figure 47:
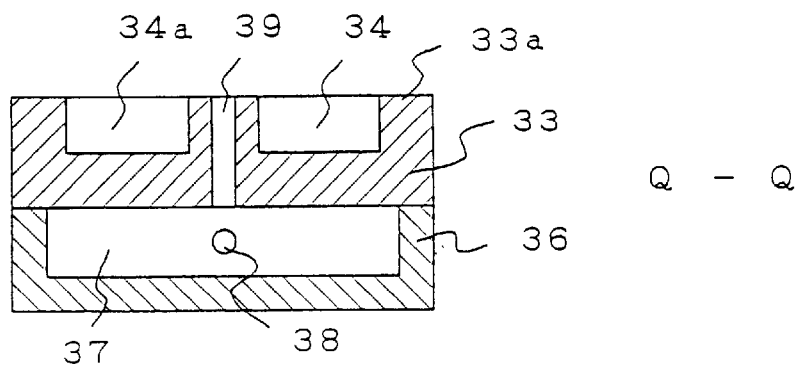
FIG. 47 is a sectional view taken on the line 47—47 in FIG. 44.
Figure 48:
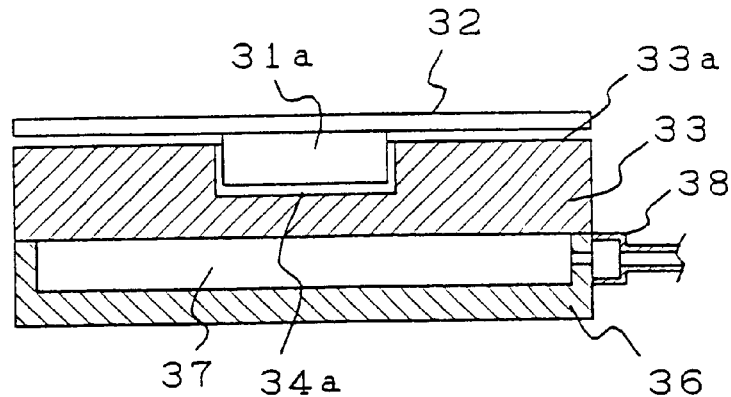
FIG. 48 is a sectional view taken on the line 45—45 in FIG. 44 for explaining how to fixedly hold the PC board by suction.
Figure 49:
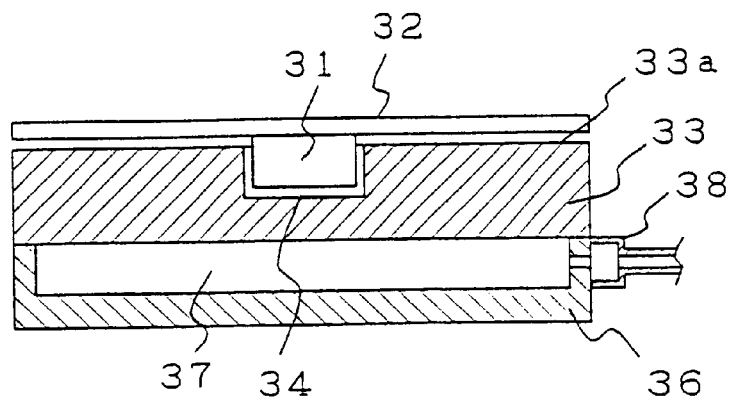
FIG. 49 is a sectional view taken on the line 46—46 in FIG. 44 for explaining how to fixedly hold the PC board.

FIGS. 29A and 29B are a bottom view and a side view showing the spacer 10 of the jig for dual-side mounting PC boards according to the present invention; FIGS. 30A and 30B are plan views showing the states of the board table before and after the spacers are placed in the component receiving holes 4 of the board table 3, respectively.

In this embodiment the parts corresponding to those in Embodiment 1 are identified by the same reference numerals and no description will be repeated thereof.

In FIGS. 29A and 29B, reference numeral 22 denotes a columnar protrusion from the underside of the spacer 10; reference numeral 22a denotes eight arm-like projections extending radially from the peripheral surface of the protrusion 22 at equiangular intervals of 45 degrees.

The protrusion 22 with the eight arm-like projections 22a is formed symmetrical with respect to its axis in the direction of projection.

In FIGS. 30A and 30B, reference numeral 23 denotes a plurality of spacer positioning holes made in the bottom of each component receiving hole 4 to receive the protrusions 22 of the spacers 10 for positioning them. The spacer positioning holes 23 are so shaped as to engage the protrusions 22 and the arm-like projections 22a. Needless to say, the spacers 10 and component receiving holes 4 are sized so that the former can be placed in the latter with ease.

The other parts not shown are the same as those in Embodiment 1, and hence no description will be given of them.

The operation will be next described.

This embodiment differs from Embodiment 1 in that the spacers 10 are placed in the component receiving holes 4 at 45 degrees thereto in the horizontal direction.

Hence, the direction of placement of the spacers 10 can arbitrarily be chosen according to various component sizes and component mounting layouts.

As will be seen from the above, according to this embodiment, it is possible to deal with various component sizes and component mounting layouts with a higher degree of flexibility by arbitrarily selecting the direction of placement of the spacers 10, in addition to the same effects as are obtainable with Embodiment 1.

Incidentally, the spacer 10 with the protrusion 22 and the arm-like projections 22a can also be combined with the jigs of Embodiments 2 through 4, in which case, too, the above-mentioned effect can be achieved.

It will be apparent that many modifications and variations may be effected without departing from the scope of the novel concepts of the present invention.

What is claimed is:

1. A jig for dual-side mounting printed circuit boards, comprising:

a board table provided with a board supporting surface for placement thereon of a printed circuit board, component receiving holes made in said board table for loosely receiving surface mounting components on said printed circuit board, and board sucking holes for vacuum-sucking said printed circuit board placed on said board table, said board supporting surface extending completely around upper ends of said component receiving holes;

spacers disposed in said component receiving holes, for supporting surface areas of said printed circuit board where no surface mounting components are mounted when said printed circuit board is placed on said board table; and a platform for supporting said board table, said platform having a pressure-reducing space which communicates with said board sucking holes and is evacuated to a vacuum by pressure-reducing means.

2. The jig as claimed in claim 1, wherein said spacers have top surfaces of different sizes corresponding to sizes of surface areas of said printed circuit board where no surface mounting components are mounted.

3. The jig as claimed in claim 1, wherein said spacers each have a protrusion on an underside thereof and said component receiving holes each have a spacer positioning hole made in a bottom thereof for engagement with said protrusion.

4. The jig as claimed in claim 3, wherein said spacer positioning holes each have a through hole communicating with said pressure-reducing space of said platform and said spacers each have a board sucking hole that communicates with said through hole.

5. The jig as claimed in claim 3, wherein said protrusion of each spacer is shaped for insertion into a corresponding spacer positioning hole with only one angular orientation with respect to an axis extending in a direction of insertion of said spacer into the corresponding spacer positioning hole.

6. The jig as claimed in claim 3, wherein said protrusion of each spacer is shaped for insertion into a corresponding spacer positioning hole with more than one angular orientation with respect to an axis extending in a direction of insertion of said spacer into the corresponding spacer positioning hole.

7. The jig as claimed in claim 6, wherein said protrusion of each spacer engages with one of said spacer positioning holes so as to prevent rotation of said spacer.

8. The jig as claimed in claim 1, wherein said board table comprises a block and said board supporting surface comprises an upper surface of said block.

9. The jig as claimed in claim 1, wherein each spacer has an upper surface flush with said board supporting surface.

10. A jig for dual-side mounting printed circuit boards, comprising:
   a board table having a top and a bottom and provided with a board supporting surface for placement thereon of a printed circuit board, component receiving holes made in the top of said board table for loosely receiving surface mounting components on said printed circuit board, board sucking holes bored through said board table for vacuum-sucking said printed circuit board placed on said board table, and a board peripheral portion sucking hole bored through said board table between upper and lower surfaces of said board table in a vicinity of a marginal portion of said board table for vacuum-sucking a peripheral portion of said printed circuit board placed on said board table;
   spacers disposed in said component receiving holes and having an upper end for supporting surface areas of said printed circuit board where no surface mounting components are mounted when said printed circuit board is placed on said board table;
   a platform having formed therein a pressure-reducing space that is closed by said board table and is evacuated to a vacuum by pressure-reducing means, said pressure-reducing space communicating with said board sucking holes, said board peripheral portion sucking hole having a lower end opening onto the lower surface of said board table outside a periphery of said pressure-reducing space;
   a groove cut in the bottom of said board table through which said board peripheral portion sucking hole communicates with said pressure-reducing space of said platform; and
   a vacuum leakage preventive block disposed in the bottom of said board table in said groove by which said peripheral portion sucking hole and part of said groove, which are located outside a periphery of said platform when said board table is placed thereon, are blocked for maintaining a vacuum.

11. The jig as claimed in claim 10, wherein said spacers have top surfaces of different sizes corresponding to sizes of surface areas of said printed circuit board where no surface mounting components are mounted.

12. The jig as claimed in claim 10, wherein said spacers each have a protrusion on a lower end thereof and that said component receiving holes each have a spacer positioning hole for engagement with said protrusion.

13. The jig as claimed in claim 12, wherein said spacer positioning holes each have a through hole communicating with said pressure-reducing space of said platform and that said spacers each have a board sucking hole that communicates with said through hole.

14. The jig as claimed in claim 12, wherein said protrusion of each spacer is shaped for insertion into a corresponding spacer positioning hole with only one angular orientation with respect to an axis extending in a direction of insertion of said spacer into the corresponding spacer positioning hole.

15. The jig as claimed in claim 12, wherein said protrusion of each spacer is shaped for insertion into a corresponding spacer positioning hole with more than one angular orientation with respect to an axis extending in a direction of insertion of said spacer into the corresponding spacer positioning hole.

16. The jig as claimed in claim 12, wherein said protrusion of each spacer engages with one of said spacer positioning holes so as to prevent rotation of said spacer.

17. The jig as claimed in claim 10, wherein said board supporting surface extends completely around upper ends of said component receiving holes.

18. The jig as claimed in claim 10, wherein said groove extends from within a periphery of said pressure-reducing space to outside the periphery of said pressure-reducing space, and said vacuum leakage preventive block blocks a portion of said groove extending outside the periphery of said pressure-reducing space.

19. The jig as claimed in claim 10, wherein said board table has an overhang which projects beyond a periphery of said platform, and a lower end of said board peripheral portion sucking hole opens onto a bottom of said overhang.

20. A jig for dual-side mounting printed circuit boards, comprising:
   a board table having a top and a bottom and provided with a board supporting surface for placement thereon of a printed circuit board, component receiving holes made in the top of said board table for loosely receiving surface mounting components on said printed circuit board, board sucking holes bored through said board table for vacuum-sucking said printed circuit board placed on said board table, and a board peripheral portion sucking hole bored through said board table between upper and lower surfaces of said board table in a vicinity of a marginal portion of said board table for vacuum-sucking a peripheral portion of said printed circuit board placed on said board table;
   a platform having formed therein a pressure-reducing space that is closed by said board table and is evacuated to a vacuum by pressure-reducing means, said pressure-reducing space communicating with said board sucking holes, said board peripheral portion sucking hole having a lower end opening onto the lower surface of said board table outside a periphery of said pressure-reducing space;
   a groove cut in the bottom of said board table through which said board peripheral portion sucking hole communicates with said pressure-reducing space of said platform; and a vacuum leakage preventive block disposed in the bottom of said board table in said groove by which said peripheral portion sucking hole and part of said groove, which are located outside a periphery of said platform when said board table is placed thereon, are blocked for maintaining a vacuum.

21. The jig as claimed in claim 20, wherein said groove extends from within a periphery of said pressure-reducing space to outside the periphery of said pressure-reducing space, and said vacuum leakage preventive block blocks a portion of said groove extending outside the periphery of said pressure-reducing space.

22. The jig as claimed in claim 20, wherein said board table has an overhang which projects beyond a periphery of said platform, and a lower end of said board peripheral portion sucking hole opens onto a bottom of said overhang.

* * * * *